United States Patent
Nadd et al.

(10) Patent No.: US 6,747,300 B2
(45) Date of Patent: Jun. 8, 2004

(54) H-BRIDGE DRIVE UTILIZING A PAIR OF HIGH AND LOW SIDE MOSFETS IN A COMMON INSULATION HOUSING

(75) Inventors: Bruno C. Nadd, Lourmarin (FR); Vincent Thiery, Aix en Provence (FR); Xavier de Frutos, Venelles (FR); Chik Yam Lee, Courtaboeuf Cedex (FR)

(73) Assignee: Ternational Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/091,194

(22) Filed: Mar. 4, 2002

(65) Prior Publication Data

US 2003/0164545 A1 Sep. 4, 2003

(51) Int. Cl.⁷ .............................. H01L 29/76; H02H 5/04
(52) U.S. Cl. .................. 257/288; 257/341; 257/356; 257/401; 257/725; 257/787; 361/24; 361/30; 361/90; 361/91.1
(58) Field of Search ................................ 257/341, 342, 257/343, 355, 213, 288, 327, 335, 356, 368, 365, 366, 401, 678, 723–725, 734, 787; 361/23, 24, 30, 33, 91.1, 118, 139, 152, 1, 28, 88, 90, 91.3, 93.1, 93.9, 94, 103; 438/142, 197, 275–277, 284, 106, 107, 109, 127

(56) References Cited

U.S. PATENT DOCUMENTS

| | | | | |
|---|---|---|---|---|
| 4,710,686 A | * | 12/1987 | Guzik | 318/293 |
| 5,159,515 A | * | 10/1992 | Fishbein | 361/18 |
| 5,245,261 A | * | 9/1993 | Ashley et al. | 318/558 |
| 5,313,150 A | * | 5/1994 | Arakawa et al. | 318/768 |
| 5,497,285 A | * | 3/1996 | Nadd | 361/103 |
| 5,502,632 A | * | 3/1996 | Warmerdam et al. | 363/98 |
| 5,536,972 A | * | 7/1996 | Kato | 257/706 |
| 5,592,117 A | * | 1/1997 | Nadd | 327/374 |
| 5,675,169 A | * | 10/1997 | Hoshi et al. | 257/355 |
| 5,973,368 A | * | 10/1999 | Pearce et al. | 257/368 |
| 6,137,705 A | * | 10/2000 | Maekawa et al. | 363/132 |
| 6,269,014 B1 | * | 7/2001 | Sander et al. | 363/132 |
| 6,359,331 B1 | * | 3/2002 | Rinehart et al. | 257/691 |
| 6,445,530 B1 | * | 9/2002 | Baker | 360/78.04 |
| 6,518,723 B2 | * | 2/2003 | Oku | 318/801 |

FOREIGN PATENT DOCUMENTS

JP  03074189 A  *  3/1991  ............ H02P/5/168

* cited by examiner

*Primary Examiner*—Alonzo Chambliss
(74) *Attorney, Agent, or Firm*—Ostrolenk, Faber, Gerb & Soffen, LLP

(57) ABSTRACT

A fully protected H-bridge for a d-c motor consists of two high side MOSFETs and a control and logic IC on a first conductive heat sink all within a first package and two discrete low side MOSFETs. The entire bridge is controlled by the IC. Shoot thru protection is provided for each leg, and a PMW soft start sequence is provided through the control of the low side MOSFETs, programed by an external, chargeable RC circuit. Input signals to the high side MOSFETs select the operation modes. Protective circuits are provided for short circuit current and over current conditions. Sleep mode and braking/non braking control is also provided.

18 Claims, 10 Drawing Sheets

LEAD FRAME PAD

(SHOOT THRU PREVENTION)

(SOFT START)

SHUT DOWN CIRCUITS

H-BRIDGE DRIVE UTILIZING A PAIR OF HIGH AND LOW SIDE MOSFETS IN A COMMON INSULATION HOUSING

FIELD OF THE INVENTION

This invention relates to a d-c motor control circuit and more specifically relates to a novel H-bridge driver for controllably driving loads such as d-c motors.

BACKGROUND OF THE INVENTION

Control circuits are well known for driving d-c motors. H-bridge circuits are commonly employed which employ two high side MOSFETs and two low side MOSFETs in which each high side device is in series with a respective low side device. The nodes between the pairs of high side and low side devices, hereinafter M1 and M2 respectively, are connected to the motor terminals; the drains of each of the high side devices are connected to a d-c source such as a battery, hereinafter $V_{cc}$, and the sources of each of the low side devices are connected to ground (hereinafter GND).

A control circuit is then provided to turn the high side and low side devices on and off to drive current through the motor windings in directions to cause rotation of the motor rotor in a clockwise or counterclockwise direction.

The MOSFETs used for such circuits are commonly individually mounted as discrete devices; and the control circuits for controlling their conduction have also been formed of discrete circuits or combinations of several integrated circuits and discretes. Further, complicated programmed circuits have also been necessary to the circuit control. All of this increases complexity and cost and reduces reliability of the control.

It would be desirable to reduce the component count of such circuits; and to simplify their operation and to avoid the need for programmed control functions.

BRIEF SUMMARY OF THE INVENTION

In accordance with the invention, a novel fully protected dual high side switch IC is provided with two additional discrete low side switches. The two high side switches and the control IC for controlling their operation may be contained on a common heat sink in a single plastic package having suitable connection pins for connection to the d-c source, ground, the motor terminals and the microcontroller which commons particular motor operations. Pins are also provided for an RC control circuit which controls soft start independently of signals from the microcontroller.

The single high side package drives and controls the entire H-bridge circuit, and contains a number of novel features.

The input signals IN1 and IN2 to the two high side FET drivers to be later described are also shown for explanatory purposes, as applied to the two high side FETs (in FIG. 1) and operate to select the motor operation modes and provide the control within each mode. First a novel self adaptive shoot thru prevention circuit (during turn off) is provided to prevent the simultaneous conduction of a series connected (half-bridge) high side MOSFET and low MOSFET. In accordance with this feature, the low side driver circuits are contained in the integrated control circuit mounted with the high side devices. The low side FETs both always normally conduct to lock the motor when the circuit is off. To turn off, the high side MOSFETs are turned off by IN1 or IN2 which turns on the low side driver circuit of its respective low side FET to turn it on before the slower high side MOSFET turns fully off, particularly when its output voltage reaches and exceeds a small value, for example, 2 volts. More specifically, to turn off a high side MOSFET, the high side FET is turned off and the circuit waits until its output voltage is less than about 2 volts. The low side FET which is off is then turned on to lock the motor load. Thus, shoot thru protection is adaptively provided without the conventional dead-time control circuit.

Second, a novel soft start sequence is provided each time the motor restarts, as selected by the IN1 and IN2 signals. The soft start circuit employs a PWM sequence which cycles a corresponding one of the low side switches to which current is steered by one of the high side switches (MOSFETs). This limits motor in rush current. The soft start sequence is operated (programmed) by a simple RC circuit and is automatically reset after starting.

Third, the novel circuit provides over current(short-circuit) and over temperature (overload) protection under the control of the IC in the high side MOSFET package. These protective functions are carried out by current sensors and thermal sensors on the high side MOSFETs, which are "IPS" switches, and provide a status feed-back to the microcontroller to call for shut-down. The protective circuit is then reset when IN1 and IN2 are both low (or zero).

Fourth, a number of other functions are carried out within the single control IC, which are selected by the combinations of signals IN1 and IN2; for example, under-voltage lockout; motor braking, temperature protection and the diagnostic feedback.

DETAILED DESCRIPTION OF THE DRAWINGS

Figure 1:
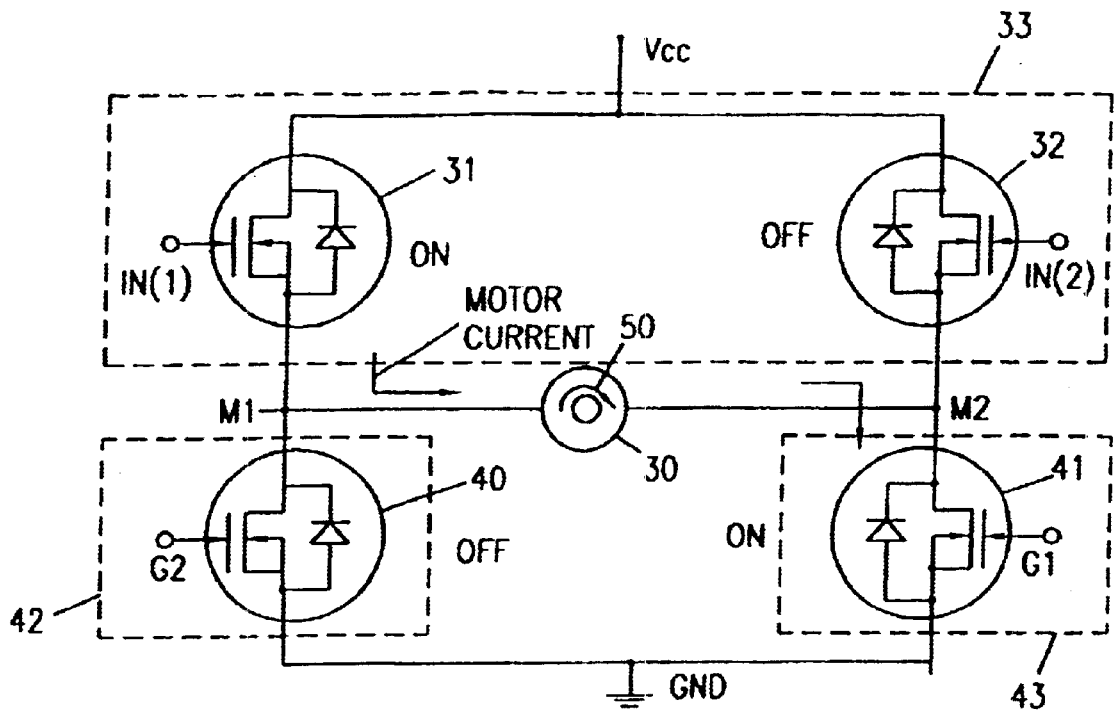
FIG. 1 is a diagram of the H-bridge circuit of the invention, and a d-c motor driven thereby.

Referring first to FIG. 1, there is shown an H bridge circuit made in accordance with the invention. FIG. 1 also shows the bridge circuit of the invention arranged to drive a d-c motor 30, although the novel bridge can be used in other applications, for example, for driving linear solenoids and other loads.

The bridge of FIG. 1 consists of first and second high side MOSgated devices 31 and 32, shown as N channel vertical conduction MOSFETs. Note that the invention can be carried out with other MOSgated devices such as IGBTs and could be carried out with P channel devices. Both MOSFETs 31 and 32 can be mounted with their drain electrodes on a common heat sink such as a conductive diced frame pad, or a conductive trace on a PCB board, and can be contained in a single package 33, shown as a dotted line box. Package 33 is shown in more detail in FIGS. 4, 5 and 6 which will be later described.

The bridge of FIG. 1 next contains two low side MOSgated devices 40 and 41. Each of MOSgated devices 40 and 41 are also shown to be N channel MOSFETs, and are separately packaged in discrete packages 42 and 43 respectively (FIGS. 2, 3 and 6).

Figure 2:
FIG. 2 is a perspective view of one of the low side packages of FIG. 1.
Figure 3:
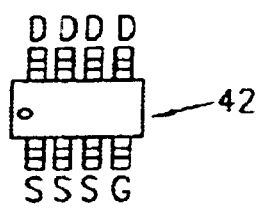
FIG. 3 is a top view of FIG. 2.
Figure 6:
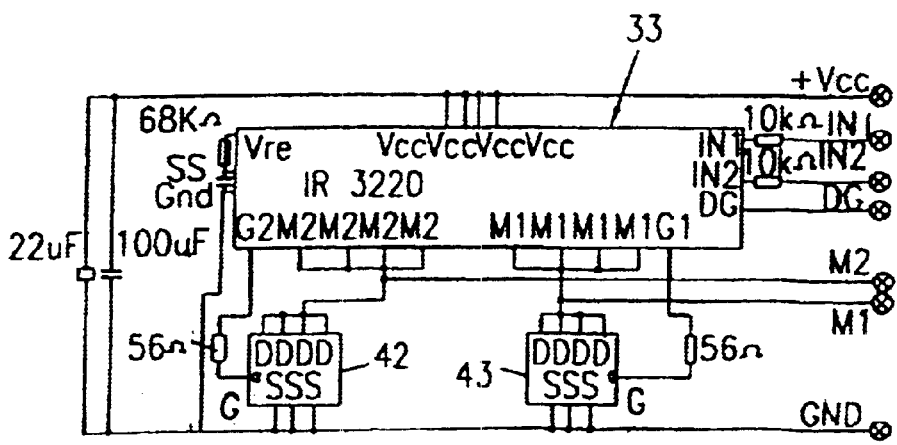
FIG. 6 shows the circuit of FIG. 1 carried out with the packages of FIGS. 2, 3, 4 and 5.

Thus, low side MOSFETs 42 and 43 may be housed in 8 lead SOIC packages as shown in FIGS. 2, 3 and 6 and may, for example, each be device type IRFL7484, available from the International Rectifier Corporation, located in El Segundo Calif. and the assignee of this application. This is a 6.8 mΩ, 40 volt device. The ratings can be changed as needed. FIGS. 2, 3 and 6 show the pin-outs of device 42 and 43 (FIG. 6), consisting of the source S, drain D and gate G terminals.

Figure 4:
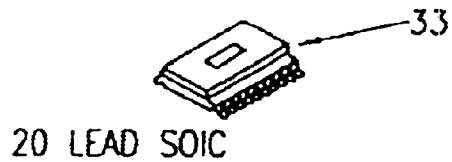
FIG. 4 is a perspective view of the package of FIG. 1A.
Figure 5:
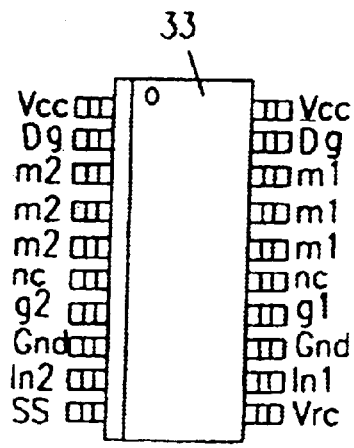
FIG. 5 is a top view of FIG. 4.

Package 33 containing high side MOSFETs 31 and 32 is shown in FIGS. 4, 5 and 6 which shows the pin outs of the package. The pin or lead definitions are as follows and their functions will be later described in greater detail:

| | |
|---|---|
| Vcc | Positive power supply |
| M1 | Motor 1 output (high side source - leg 1) |
| M2 | Motor 2 output (high side source - leg 2) |
| G1 | Gate 1 drive output (low side gate - leg 1) |
| G2 | Gate 2 drive output (low side gate - leg 2) |
| Gnd | Power supply return |
| IN1 | Logic input 1 (leg 1 Cdt./mode) |
| IN2 | Logic input 2 (leg 2 Cdt./mode) |
| Dg | Diagnostic output (open drain) |
| Vrc | Voltage ref. Output (soft-start RC) |
| SS | RC soft-start input (the voltage on this input drives the switching duty cycle) |

Figure 1A:
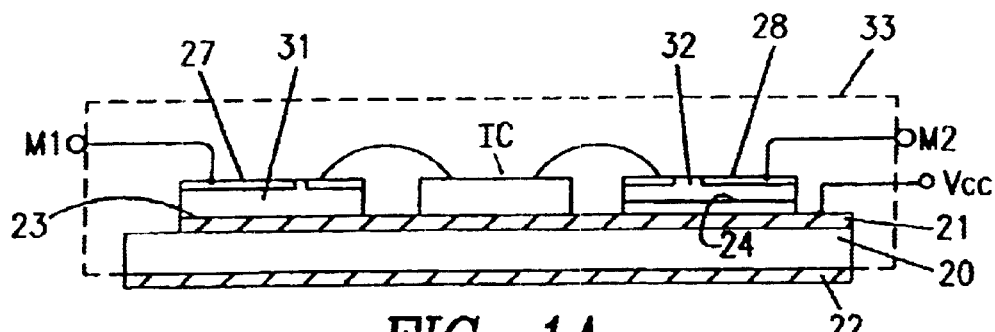
FIG. 1A is a cross-section of the novel high side driver package of the invention.
Figure 1B:
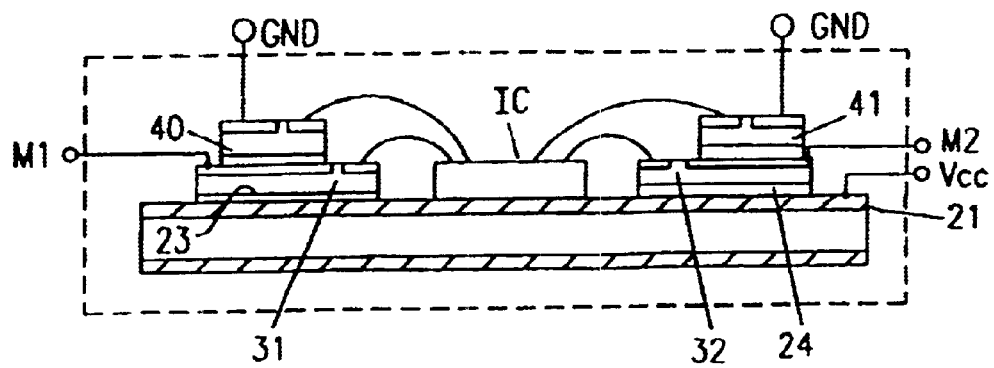
FIG. 1B is a cross-section of another embodiment of the package in which all 4 MOSFETs are in a single package.
Figure 1C:
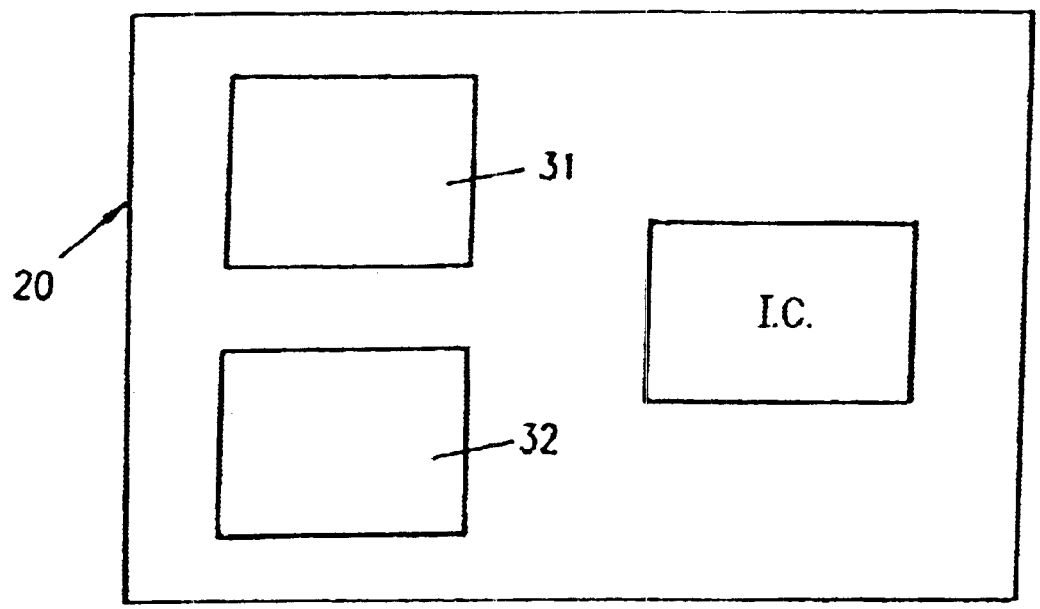
FIG. 1C shows a top view of a preferred topology for arranging the high side MOSFETs and the IC of FIG. 1A.
Figure 1D:
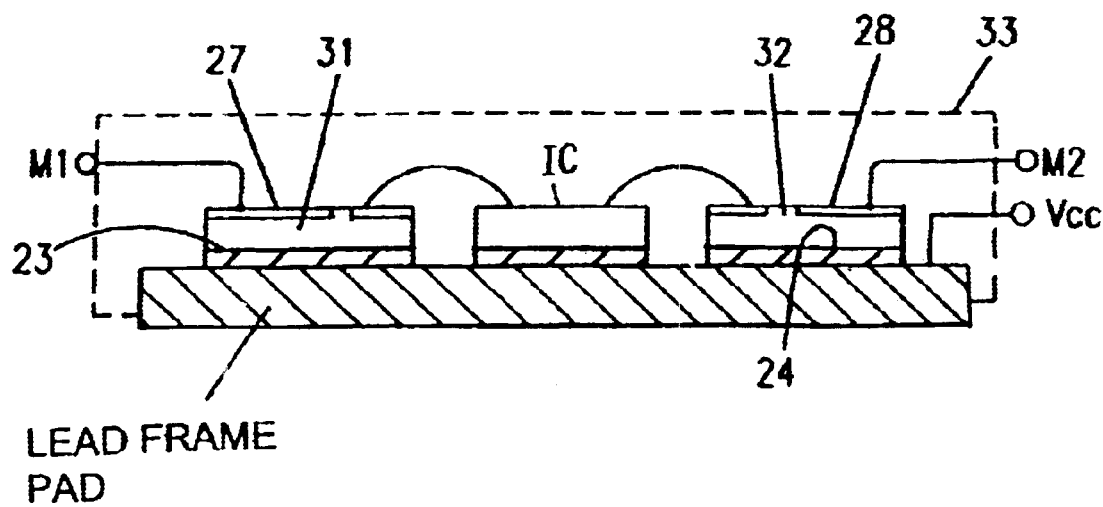
FIG. 1D shows a cross-section like that of FIG. 1A in which a conductive lead frame support is provided.

The source electrodes 27 and 28 of devices are preferably mounted on a common conductive support, for example, the main pad of a conductive copper or copper alloy lead frame, as shown in FIG. 1D. If lead frame is used, the pins described above will be integral with the lead frame before separation of the lead frame elements.

FIG. 1A shows another possible support arrangement for MOSFETs 31 and 32 on a support circuit board 20 instead of a lead frame. Board 20 has a copper coatings 21 and 22 and the drain electrodes 23 and 24 of MOSFETs 31 and 32 respectively are conductively connected to conductive layer 21. The source electrodes 27 and 28 of devices 31 and 32 respectively in FIGS. 1A and 1D are connected to terminals M1 and M2 which protrude beyond the boundaries of insulation housing 33. The source electrodes 27 and 28 of MOSFETs 31 and 32 respectively are connected to the external ground pins GND. The gate control electrodes of MOSFETs are then connected as by wire bonding to a suitable control IC which will be later described and which is also supported on board 20. The control IC can be mounted to the layer 21 (or conductive lead frame in FIG. 1D) by an insulation die attach medium.

FIG. 1B shows a modification of FIGS. 1A and 1D wherein the low side MOSFETs 40 and 41 are mounted atop MOSFETs 31 and 32 respectively with their drains adhesively and electrically connected to the sources of MOSFETs 31 and 32. Thus, the entire driver is contained within a single package in FIG. 1B. Note that the arrangement of FIG. 1B ca be used with the lead frame support of FIG. 1D.

FIG. 1C shows a top view of a further preferred embodiment of the arrangement of MOSFETs 31 and 32 and the control IC.

The circuit of FIGS. 1 and 6, as will be later described is a fully protected dual high side switch that features a whole H-bridge control. The protective circuits may be integrated into the package 33, with the two low side MOSFETs 40 and 41. The inrush current of ad-c motor load 30 may be limited and the motor 30 driven in both directions with a braking mode, without the need for external power management. Current protection (short circuit) and temperature responsive shut down due to overload may also be provided as later described.

The high side switches 31 and 32 provide direction capability and the H-bridge protection. The on/off state of MOSFETs 31, 32, 40 and 41 are shown for motor rotation in the direction of arrow 50 in FIG. 1 as one example of the control function. The low side MOSFETs 40 and 41 bring flexibility to the circuit by offering high frequency switching ability. Therefore, hard start-up of the motor can be avoided by a smooth low stress speed ramp up, as will be later described.

Before describing the control circuitry dealing with sleep mode, shoot-thru protection, soft start, and thermal protection, it is useful to understand the turn on and turn off sequences for MOSFETs 31, 32, 40 and 41.

This operation is best understood from the following "Truth Table" for 6 different control modes of motor 30:

| IN1 | IN2 | MODES | DG | FET31 | FET40 | FET32 | FET41 | SS Reset |
|---|---|---|---|---|---|---|---|---|
| L | L | Stand-by with braking-sleep mode | H | OFF | ON | OFF | ON | ON |
| L | H | Forward rotation (normal operation) | H | OFF | ON | ON | OFF | OFF |

-continued

| IN1 | IN2 | MODES | DG | FET31 | FET40 | FET32 | FET41 | SS Reset |
|---|---|---|---|---|---|---|---|---|
| L | H | Forward rotation (protection triggered) | L | OFF | ON | OFF | OFF | OFF |
| H | L | Reverse rotation (normal operation) | H | ON | OFF | OFF | ON | OFF |
| H | L | Reverse rotation (protection triggered) | L | OFF | OFF | OFF | ON | OFF |
| H | H | Stand-by without braking | H | OFF | OFF | OFF | OFF | ON |

In the above table, it will be later shown that in the "sleep mode", all protection circuits are reset; and that MOSFET 40, while shown "ON" in reverse rotation ("normal operation" and "protection triggered") that the low side part is switching.

Note that in the sleep mode (with the motor braking on) both low side devices should be ON, but a novel control circuit using minimum current drain for keeping them in this condition is provided.

Figure 7:
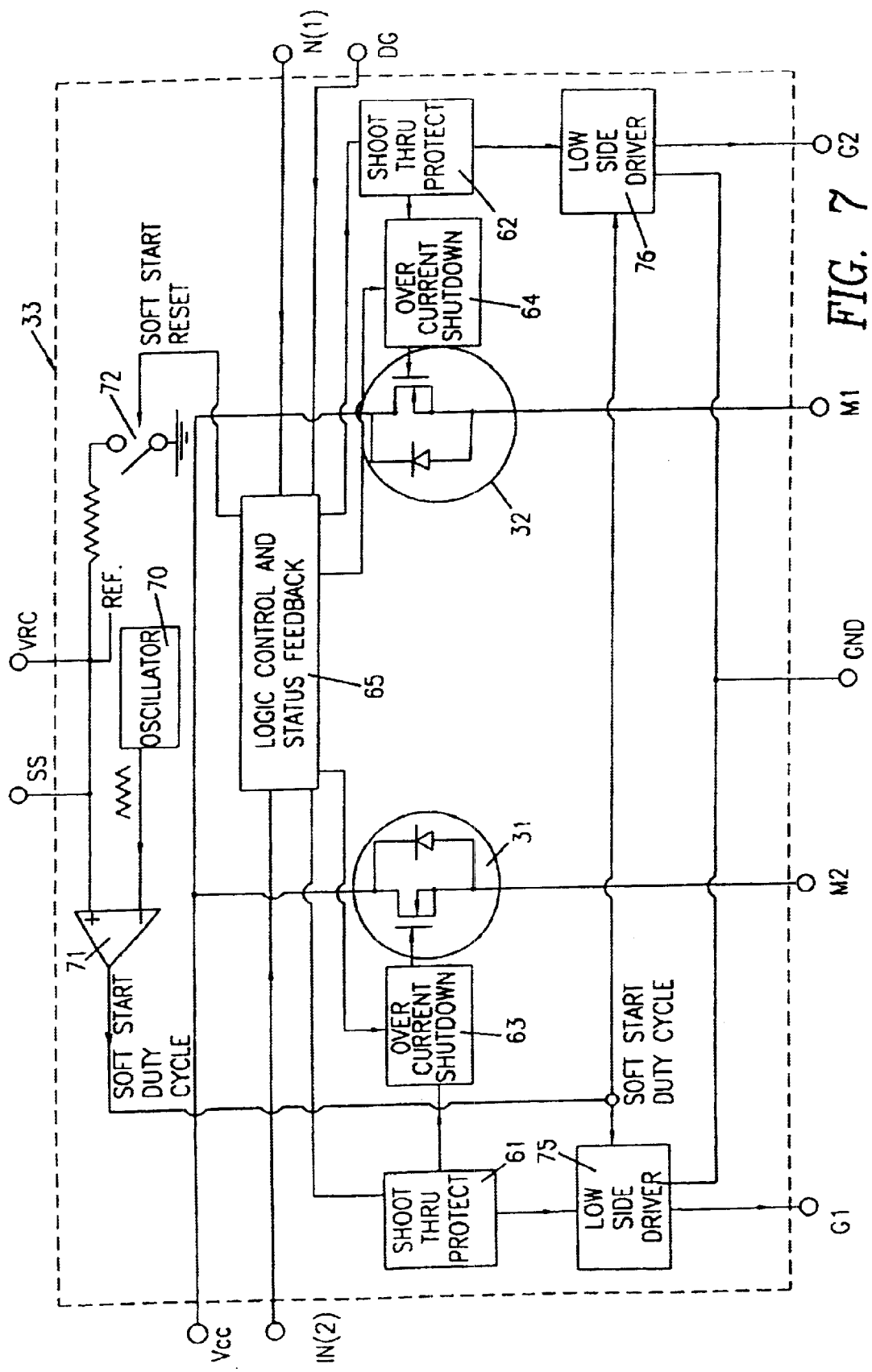
FIG. 7 is a circuit diagram of the high side packages of FIG. 2 including the control IC and other control circuits.

FIG. 7 is a block diagram of the circuitry, including control circuits contained within package 33. Thus, MOSFETs 31 and 32 are provided with respective shoot-thru protection circuits 61 and 62 respectively and with over current shut down circuits 63 and 64 respectively. A logic control and status feedback circuit 65 is provided to control the overcurrent and shoot-thru protection circuits. Finally, a soft start control circuit consisting of an oscillator 70, comparator 71 which switches relative to the reference REF derived from pin $V_{RC}$, and a soft start reset switch 72 is provided and is under the control of circuit 65. These various components may be integrated in one or more IC chips within package 33.

The architecture of the circuit of FIG. 7 embodies several basic features:

First, each leg of the H-bridge, (including low side devices 40 and 41 of FIG. 6) are totally independent of one another. Each features its own current protection and shoot-thru circuitry. Thus, no "diagonal" command among the four MOSFETs is needed.

Second, the normal quiescent state of the low side MOSFETs 40 and 41 is ON. Since each leg of the bridge is independent, the input signals IN(1) and IN(2) control or drive the high side MOSFET 31 or 32 and low side MOSFET 40 and 41 respectively. That is, the low side devices 40 and 41 are driven by gate drivers 75 and 76 respectively which are, in turn, driven from shoot-thru protect circuits 61 and 62 of the high side FETs 31 and 32 respectively.

Regarding the shoot-thru protection, as stated before, both low side MOSFETs will be normally ON (for braking) when the circuit is off. Therefore, care must be taken to turn the proper low side device on before its series high side device in turned off. In accordance with the invention, the appropriate low side MOSFET must turn on when the node to its series high side device is greater than some given value, for example, two volts.

Third, the soft start circuitry of oscillator 70 and comparator 71 bring a gradually increasing pulse width modulated signal to both low side MOSFETs 40 and 41 without consideration of the direction of current flow in the high side MOSFETs 31 and 32. Therefore, the pulse width modulation circuitry is almost independent and offers great flexibility to extended operational requirements, for example, control of motor speed or torque.

Each of the above features are chosen for safe bridge operation or to increase independence among the IC functions without the need for any H bridge logic circuitry. However, other functions related to the IC may still be implemented including: undervoltage lockout; temperature protection; and diagnostic feedback. These functions may all be gathered in the logic control and status IC 65.

The ultimate control of the circuit of FIGS. 6 and 7 is derived from a micro controller. Thus, in FIG. 8, a micro controller 80 is provided, having a diagnostic feedback terminal or pin 81 connected to the DG pin on package 33. The micro controller also provides a clockwise control signal output pin 82 and a counter clockwise rotation pin 83 connected to IN(1) pin and IN(2) pin respectively on package 33. These inputs will turn MOSFETs 31, 32, 40 and 41 on and off in the necessary sequence to cause motor 30 to rotate clockwise or counter clockwise respectively. In a typical application, motor 30 may move rack 85 to the left or right until reaching stop switches 86 or 87 respectively to stop motor operation past a given limit.

Figure 8:
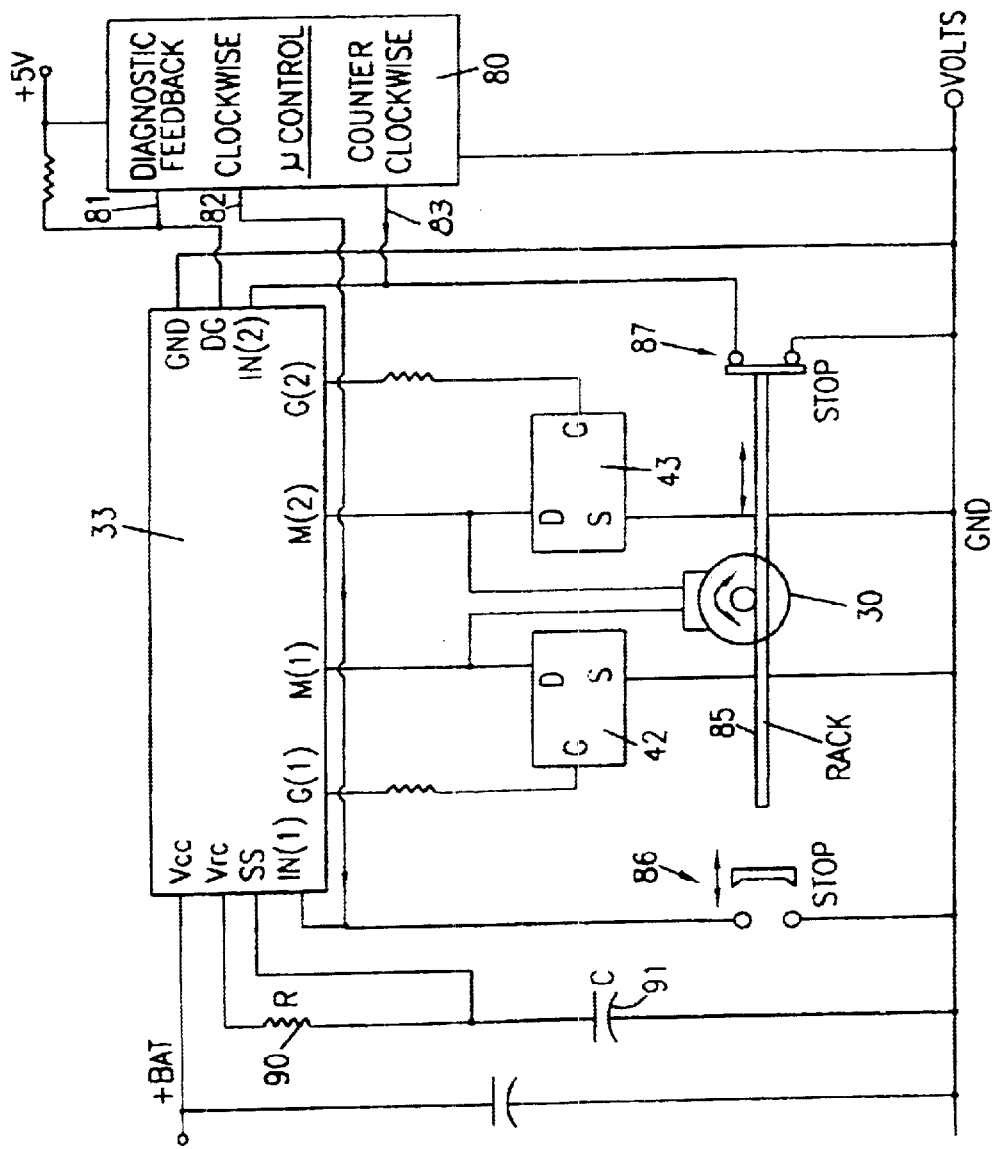
FIG. 8 is a diagram similar to that of FIG. 6 showing a particular load circuit and an RC timing circuit for the soft start circuit.

FIG. 8 also shows resistor 90 and capacitor 91 which are connected to the RC pin and the SS (soft start) pin on circuit 33. These components control and program the soft start sequence which will be later described.

Figure 9:
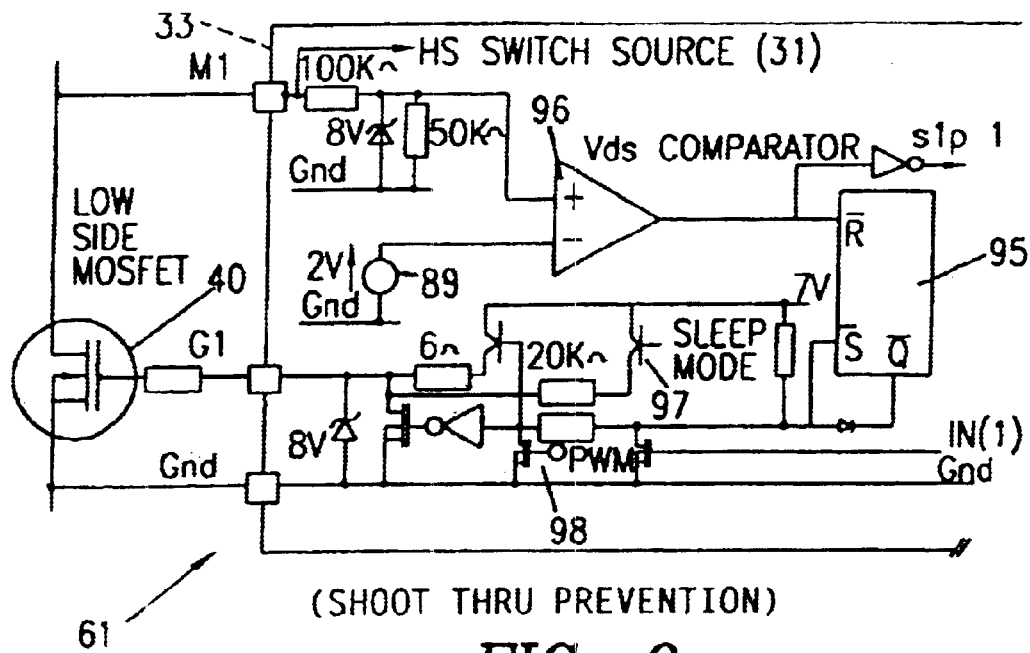
FIG. 9 shows portions of the shoot-thru prevention circuit in the control IC.

FIG. 9 shows the novel structure employed for the shoot thru protection circuits 61 and 62 of FIG. 7. Traditional shoot-thru control circuits employ an intentional dead time between the conduction of the series high side and low side devices. The present invention employs a novel adaptive dead time, in which the voltage at node M(1) is compared to a 2 volt reference 89 to turn on MOSFET 40 when MOSFET 31 begins to turn off. In particular, FIG. 9 shows the shoot thru protection circuit 61 with low side MOSFET 40. The M1, G1 and GND pins of IC/package 33 are also shown. The shoot thru circuitry comprises an R-S flip-flop 95 and a comparator 96 which is a $V_{DS}$ comparator for MOSFET 40.

A two volt input to comparator 96 causes a constant ON quiescent signal to be applied to pin G1. A "sleep mode" input is connected to transistor 97 to provide a low power consumption circuit to keep MOSFET 40 in a quiescent ON state. (Note that the same circuitry is used for low side MOSFET 41). Further, a PWM signal is applied to transistor 98 (simultaneously to both low side MOSFETs 40 and 41), but only the inactive high side by will be able forward the signal to pin G1 or pin G2.

The novel shoot-thru protection circuit of (each leg) of the invention takes advantage of the switching time difference between the low side MOSFETs 40 and 41 and the high side MOSFETs 31 and 32 respectively. Thus, each of the high side MOSFETs 31 and 32 are provided with conventional charge pumps to obtain a gate voltage higher than $V_{CC}$. These charge pumps cause the high side MOSFETs to have a slower turn on/turn off time, compared to that of the low side MOSFETs, which are directly in the circuit of FIG. 9. Therefore, when IN1 [or IN2] is set high, the signal applied to pin G1 immediately turns off MOSFET 40 well prior to the time that the charge pump circuitry has switched on the corresponding high side MOSFET 31. Thus, no shoot-thru path is formed between MOSFETs 31 and 40. Similarly, when the signal at IN1 is set low, the high side switch 31 turns off slowly, but the low side MOSFET 40 cannot turn back on until the voltage $V_{DS}$, monitored by comparator 96 has reduced to two volts and back to its quiescent ON state.

Consequently, the novel circuit of FIG. 9 defines a self-adaptive dead time circuitry without circuit complexity. Essentially, the R-S flip flop 95 and comparator 96 memorize the request at IN1 (or similarly at [IN2]) for the turn on of high side MOSFET 31; and the comparator resets the memory when it is fully off [eg, (M1−GND)<2V].

Figure 10:
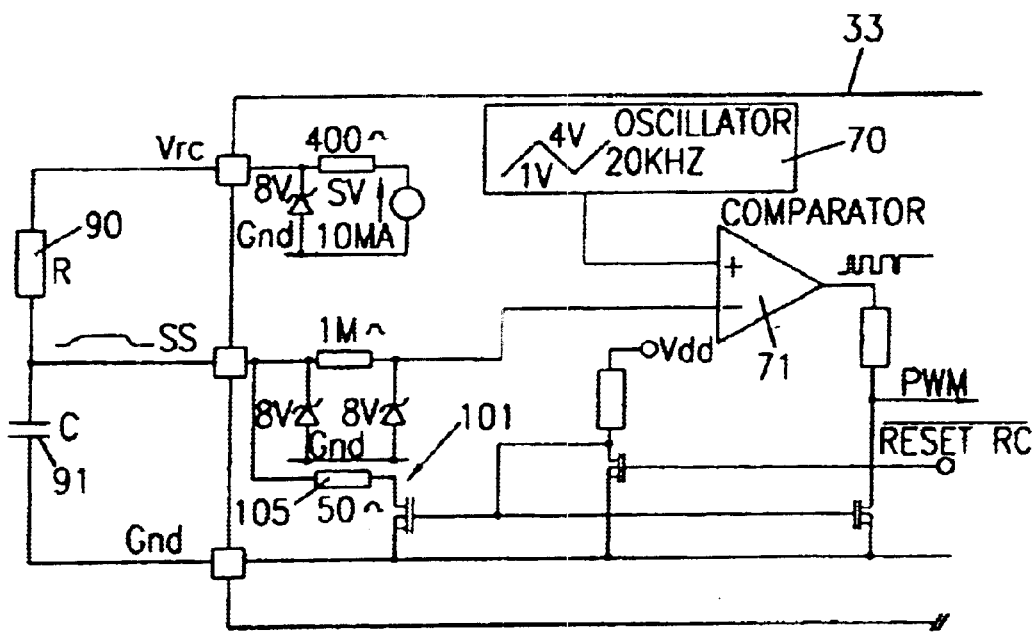
FIG. 10 shows portions of the soft start circuit.

FIG. 10 shows the novel soft start circuitry which is contained in the IC within package 33.

More specifically, FIG. 10 shows the resistor 90 and capacitor 91 of FIG. 8 and the oscillator 70 and comparator 71 of FIG. 7. Resistor 90 and capacitor 91 are externally mounted on a circuit board in an accessible position so they can be replaced by different value devices to change the RC time constant as desired. Also shown are pins $V_{RC}$, SS and GND of package 33.

The circuit of FIG. 10 generates the pulse width modulated (PWM) signal for the start-up of the circuit. Oscillator 70 produces a sawtooth output at above 20 kHz which oscillates between about one and about four volts. This sawtooth output is compared to the voltage at pin SS so that kin SS drives a duty cycle from 0% (if SS is less than 1 volt) to 100% (if SS is greater than 4 volts).

The pulse duration output of comparator 71 then gradually increases, as shown, without need for control by a microcontroller or program. The SS pin is normally at the central point of the RC network 90, 91 powered by the RC pin. Finally a discharged circuit 101 is implemented to reset and hold the SS pin low while the H-bridge is off.

In operation, when the IN1 pin is set high, low side MOSFET 40 turns of and, later, as previously described, high side MOSFET 31 turns on, and the discharge circuitry 101 is released. The voltage at pin SS increases slowly, resulting in a smooth duty cycle variation (PWM signal) at the gate of the inactive leg of the low side MOSFET. Therefore, the switching wave form seen by dc motor 30 goes from 0% to 100% duty cycle, offering a stress-free ramp-up to the load on the motor shaft.

The total switching duration of the soft start sequence is 1 to 4 times the time constant of RC circuit 90, 91. Capacitor 91 is discharged through resistor 105 (50 Ω) when the H-bridge conduction stops. The capacitor 91 must discharge completely before any new start up. Further, the load on the motor 30 shaft must come to a complete stop before requesting a new start-up sequence. The soft start duration will vary with different applications, depending on the d-c motor characteristics, load, friction and the like, with trade off being made between inrush current limitation and soft start duration. The value of RC can vary from very smooth start in which soft start duration is as much as 10 times the time constant Tau (for full torque start up) to as low as 2 times the time constant Tau for low inertia, low torque start up.

Figure 11:
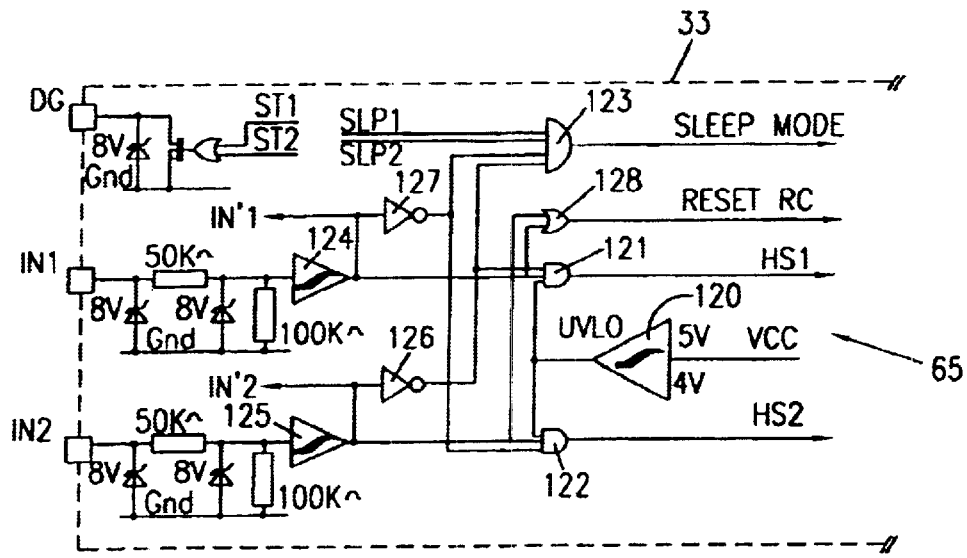
FIG. 11 shows portions of the logic control for sleep mode and RC reset.

FIG. 11 shows a portion of the IC logic control circuit 65 of FIG. 7, and shows pins DG, IN1 and IN2.

The circuit includes a hysterisis undervoltage lock-out circuit 120 which is connected to $V_{CC}$ and turns off gates 121 and 122 to prevent turn on of MOSFETs 31 and 32 when $V_{CC}$ reduces, for example to below 4 volts. The gates 121, 122 are inhibited until $V_{CC}$ rises to 5 volts when automatic restart can take place.

Also shown in FIG. 11 is the sleep mode circuitry including gate 123, hysterisis elements 124, 125, and inverters 126, 127 which switches the entire IC into a low power consumption mode (for example, less than 50 microamperes) when both IN1 and IN2 are zero. Note that both low side MOSFETs 40 and 41 remain ON during the sleep mode.

Further a non-braking mode is added, as shown in FIG. 11, when IN1 and IN2 are both high.

Finally, the charge/discharge reset signal (reset RC) at gate 128 is generated when the H bridge is off, and whether it is braking or not. The open collector output of the pin DG is active due to the inner high side switch status.

High side switches 31 and 32 are preferably IPS (intelligent power switch) devices having current and thermal sensing capability. These devices may employ standard vertical conduction MOSFETs with current sensing with laterally displaced thermal monitor elements to measure the die temperature. More specifically, switches 31 and 32 feature co-packed or integrated circuits containing charge pump, over-current protection (shut-down type) status feedback and active clamp capability. Active clamp capability can be useful in certain abnormal conditions, such as an automotive load dump condition.

Figure 12:
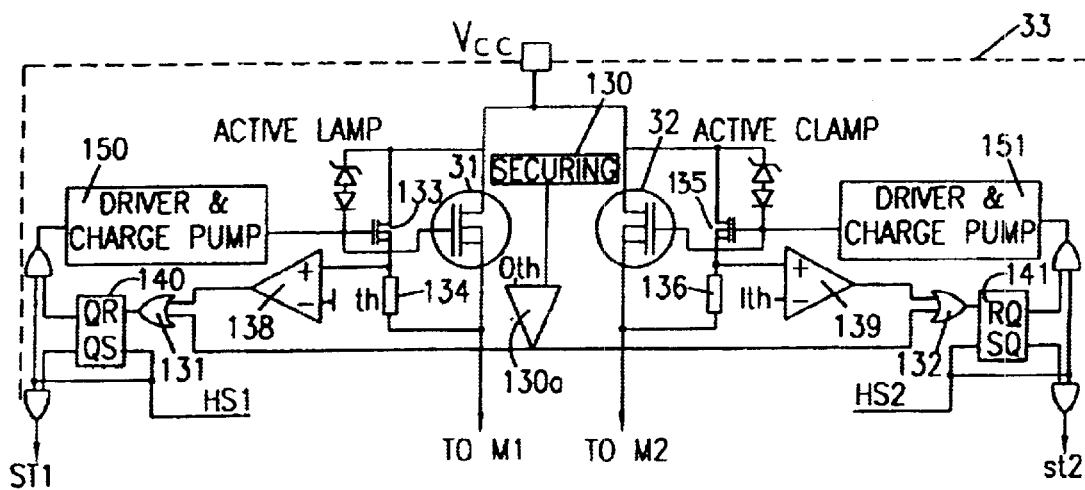
FIG. 12 shows portions of the shut down circuits in the IC control.

FIG. 12 shows the MOSFETs 31 and 32 with their protective circuit. Thus a temperature sense device 130 of any desired type provides an output to comparator 130a. If the temperature exceeds a threshold value θth, an output is applied to or gates 131 and 132. A current monitor circuit, including current mirror circuits 133, 134 for MOSFET 31 and 135, 136 for MOSFET 32 provide inputs to comparators 138 and 139 respectively, which compare the measured current to a threshold value Ith and, if the current exceeds the reference value, applies signals to OR gates 131 and 132 respectively.

An output from gates 138 or 139 is connected to and operates RS flip-flops 140 and 141 respectively. These produce outputs st1 or st2 which are coupled to the DG pin in FIG. 11.

FIG. 12 further shows driver and charge pump circuits 150 and 151 for MOSFETs 31 and 32 respectively. These are also disabled by a measured current fault or thermal fault by the operation of flip-flops 140 and 141 to cause the current or thermal shut down of the bridge. Note, however, that the low side MOSFETs 40 and 41 remain ON until the reset condition is applied.

Since the MOSFETs 31 and 32 may have to dissipate energy at the same time (one ON and the other free-wheeling) the thermal protection circuit 130, 130a latches off as soon as the junction temperature of either of MOSFETs 31, 32 exceeds, for example, 165° C., and the fault condition is forwarded to pin DG as described above. The protective circuits are reset when both IN1 and IN2 are low for a minimum time, for example 50 microseconds.

The above described functions make the device of the invention particularly suitable for d-c actuator applications, as shown in FIG. 8. Thus, it offers a "sleep mode" that shorts the d-c motor 30 (the braking mode has IN1 and IN2 both low) and a soft switching ramp up for movement in both directions without any added circuitry. Current shutdown protects the application in case of a short between motor wires or of any motor wire to ground. Further, assuming sufficient cooling of the low side MOSFETs 40 and 41, the entire H-bridge is protected against overtemperature.

The present invention also embodies a novel layout and thermal control considerations. Thus, in FIG. 12, thermal sensor 130 latches off the appropriate high side switch 31 and 32 when its junction temperature reaches a predetermined value, for example, 165° C. This protection arrangement assumes that the junction temperatures of MOSFETs 40 and 41 will always be lower then that of the high side MOSFETs.

It has been found that a sufficient margin of error to ensure thermal shut down responsive to the high side devices 31, 32 before it is require by the low side devices 40, 41, is that the low side temperature increase ΔT should be one half that of the high side devices. That is;

$$R_{DSON}LS \cdot Rthjals < 1/2 \, [R_{DS(ON)}HS \cdot Rthjahs]$$

where:

$R_{DS(ON)}$ls is the on resistance of low side MOSFETs 40, 41;

$R_{DS(ON)}$hs is the on resistance of high side MOSFETs 31, 32;

Rthjals is the junction to ambient thermal resistance of low side MOSFETs 40, 41; and Rthjahs is the junction to ambient thermal resistance of high side MOSFETs 32, 32.

Note that Rthja depends on packaging and the heat sink receiving this MOSFET. A copper lead frame offers the est thermal and electrical performance. If a PCB is used, Rthja may be decreased by employing a suitable copper plate on the PCB support or other support for the MOSFETs or with suitable heat spreaders and with heat removal through suitably designed connection pins or other means.

As one example of a fully protected H-Bridge driver of the invention, the circuit was used to drive a dc motor and had the following characteristics:

$R_{DSON}$—12 mΩ

$V_{CC}$—5.5 to 35 V $I_{CONT}$@85° C. ambient—6.0 amperes $I_{SHUTDOWN}$—30 amperes Operating Frequency—20 kHz The absolute maximum ratings, which are sustainable limits beyond which damage to the driver may occur are as follows, with voltages referred to the GND pin; @a 25° C. ambient; symbols with (2), referring to the M2 output:

| Symbol | Parameter | Min. | Max. | Units |
|---|---|---|---|---|
| Vm1 (2) | Maximum M1 (M2) voltage (active clamp) | Vcc − 37 | Vcc + 0.3 | V |
| Vin1 (2) | Maximum IN 1 (IN 2) voltage | −0.3 | 5.5 | |
| Vcc/gnd | Maximum Vcc pin to GND pin voltage | 0.3 | 50 | |
| I in 1 (2) | Maximum IN1 (IN2) current | −1 | 10 | mA |
| Vg1 (2) | Maximum Gate 1 (Gate 2) voltage | −0.3 | 7.5 | V |
| Vss | Maximum SS voltage | −0.3 | 5.5 | |
| Vrc | Maximum Vrc voltage | −0.3 | 5.5 | |
| Irc | Maximum output current of the Vrc pin | — | 1 | mA |
| Vdg | Maximum diagnostic output voltage | −0.3 | 5.5 | V |
| Idg | Maximum diagnostic output current | −1 | 10 | mA |
| Isd cont. | Diode max. Permanent current | | | A |
| | (Rth = 60° C./W) (1) | — | 3.0 | |
| | (Rth = 45° C./W) (1) | — | 4.0 | |
| Isd pulsed | Diode max. pulsed current (1) | — | 15 | |
| ESD 1 | Electrostatic discharge (human bodymodel C = 100 pF, R = 1500 Ω) | — | tbd | V |
| ESD 2 | Electrostatic discharge (machine model C = 200 pF, R = 0 Ω, L = 10 μH) | — | tbd | |
| PD | Maximum power dissipation (Rth = 60° C./W) | — | 1.5 | W |
| TJ max. | Max. storage & operating junction temperature | −40 | +150 | ° C. |
| TL | Lead temperature (soldering 10 seconds) | — | 300 | |
| Vcc max | Maximum Vcc voltage | — | 37 | V |
| Ig1 (2) max. | Maximum gate current (Ton < 5 μS) | — | 100 | mA |
| Ig1 (2) avg. | Maximum average gate current | — | 10 | |

The device thermal characteristics are:

| Symbol | Parameter | Typ. | Max. | Units |
|---|---|---|---|---|
| $R_{th}$ 1 | Thermal junction to amb. Resistance (stnd footprint 1 MOS on) | 60 | — | ° C./W |
| $R_{th}$ 2 | Thermal junction to ambient resistance (1" sq. footprint 1 MOS on) | 45 | — | |

Typical Operating conditions are as follows:

| Symbol | Parameter | Min. | Max. | Units |
|---|---|---|---|---|
| Vcc | Continuous Vcc voltage (2) | 8 | 18 | V |
| Vin1 (2) | High level IN 1 (IN 2) input voltage | 4 | 5.5 | |
| Vin1 (2) | Low level IN 1 (IN 2) input voltage | −0.3 | 0.9 | |
| Iout Ta = 85° C. | Continuous output current (Rth/amb < 5° C./W, Tj = 125° C.) | — | 7.0 | A |
| Iout Ta = 105° C. | Continuous output current (Rth/amb < 5° C./W, Tj = 125° C.) | — | 4.5 | |
| R in | Recommended resistor in series with IN pin | 10 | 20 | kΩ |
| Rdg | Recommended pull-up resistor on DG pin | 1 | 20 | |
| R | Soft-Start resistor | 5.0 | 100 | |
| C | Soft-Start capacitor | 0.1 | 3.3 | μF |
| R gate | Recommended gate resistor for Low Side Switch | 0 | 50 | Ω |

Finally, the Static Electrical characteristics are, at $T_j=25°$ C. and Vcc=14V:

| Symbol | Parameter | Min. | Typ. | Max. | Units | Test Conditions |
|---|---|---|---|---|---|---|
| Rds1 on | ON state resistance $T_j + 25°$ C. | — | 9 | 12 | mΩ | Vin1, 2 = 5 V, 1 m1, 2 = 5 A |
| Rds2 on | ON state resistance $T_j + 150°$ C. | — | 16 | 22 | | |
| Vcc oper. | Functional voltage range | 5.5 | — | 35 | V | |
| Vclamp1 (2) | Vcc to M1 (M2) clamp voltage | 37 | 40 | 48 | | Id = 10 mA see FIGS. 1, 2 |
| Vf1 (2) | Body diode 1 (2) forward voltage | — | 0.9 | — | | Id = 5a, vin1, 2 = 0 V |
| IM1 (2) leakage | M1 (M2) output leakage current | — | 10 | 50 | μA | Vm1, 2 = 0 V; Tj = 25° C. Vin1(2) = 0 V |
| Icc off | Supply current when off (sleep mode) | — | 10 | 50 | | |
| Icc on | Supply current when on | — | 8 | — | mA | Vin1 = 5 V |
| Vdg1 | Low level diagnostic output voltage | — | 0.3 | — | V | Idg = 1.6 mA |
| Idg leakage | Diagnostic output leakage current | — | — | 10 | μA | Vdg = 5.5 V |
| Vih1 (2) th. | IN1 (IN2) high threshold voltage | — | 2.6 | — | V | |
| Vil1 (2) th. | IN1 (IN2) low threshold voltage | — | 2.0 | — | | |
| Iin1 (2) | ON state IN1 (IN2) positive current | — | 25 | — | μA | Vin1, 2 = 5 V |
| Vccuv | Vcc UVLO positive going threshold | — | 5 | — | V | |
| Vccuv− | Vcc UVLO | — | 4 | — | | |
| Vss+ | SS high level threshold | — | 4 | — | | |
| Vss− | SS low level threshold | — | 1 | — | | |
| Iss leakage | SS pin leakage current | — | 0.1 | 10 | μA | |

Figure 13:
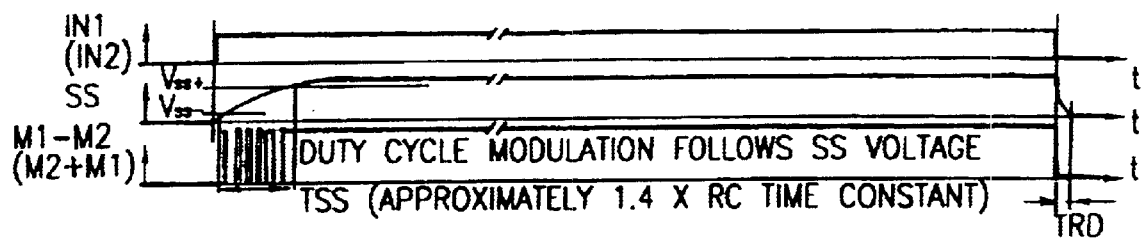
FIGS. 13 to 18 show various operation characteristics of the circuits of FIGS. 1 to 12.

FIG. 13 shows a timing diagram which illustrates the soft start sequence previously described. The three lines of FIG. 13 show the voltages at pins IN1 [or IN2]; SS; and [M1−M2] (M1+M2) on a common time base t. Note that the duty cycle modulation at pin M1 follows the increase in the voltage at pin SS, and the modulation period Tss is set at about 1–4 RC (time constant).

Figure 14:
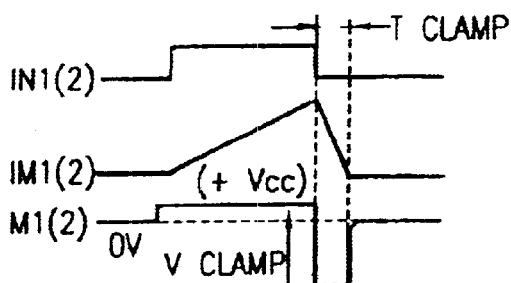

FIG. 14 shows the active clamp voltage wave forms for the active clamp of FIG. 12, at pins IN1 or 2 and M1 or 2, and the current at pin M1 or 2 on a common time base.

Figure 15:
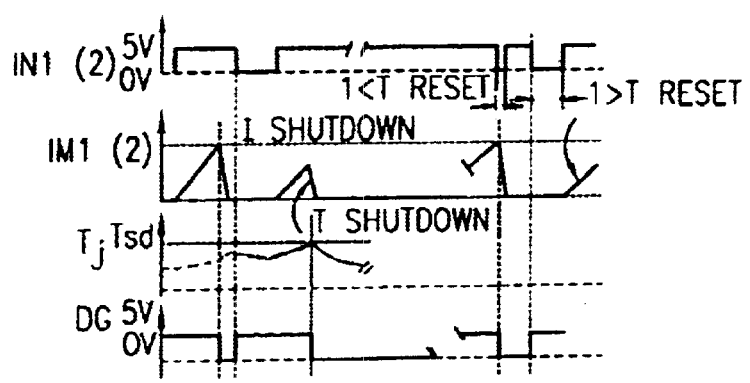

FIG. 15 shows the novel protection scheme timing diagram at pins IN1 or 2; DG; M1 or 2 (a current wave shape) and a presumed Tj on a common time base. When either IM1 or Tj reach shut down values, the bridge will be turned off.

Figure 16:
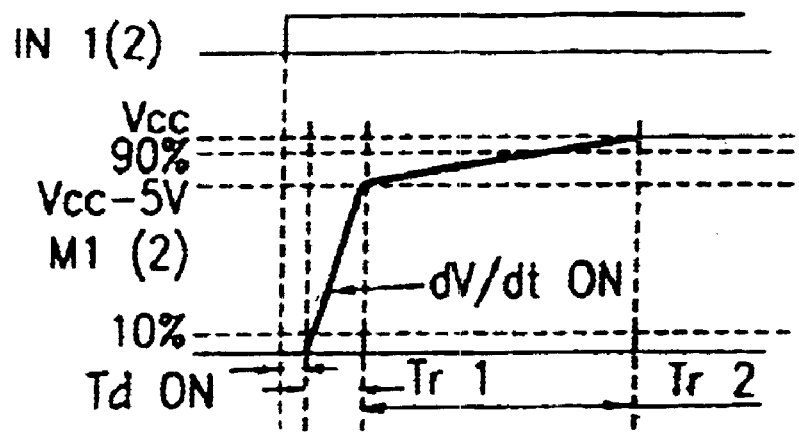
Figure 17:
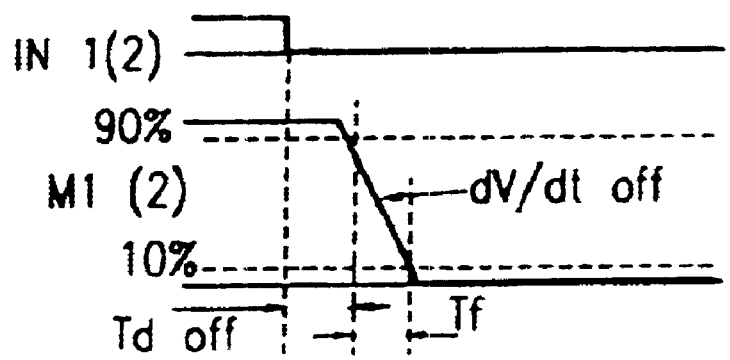

FIGS. 16 and 17 show turn on and turn off conditions at pins IN1 and M1 on a common time base and define various terms previously used.

Figure 18:
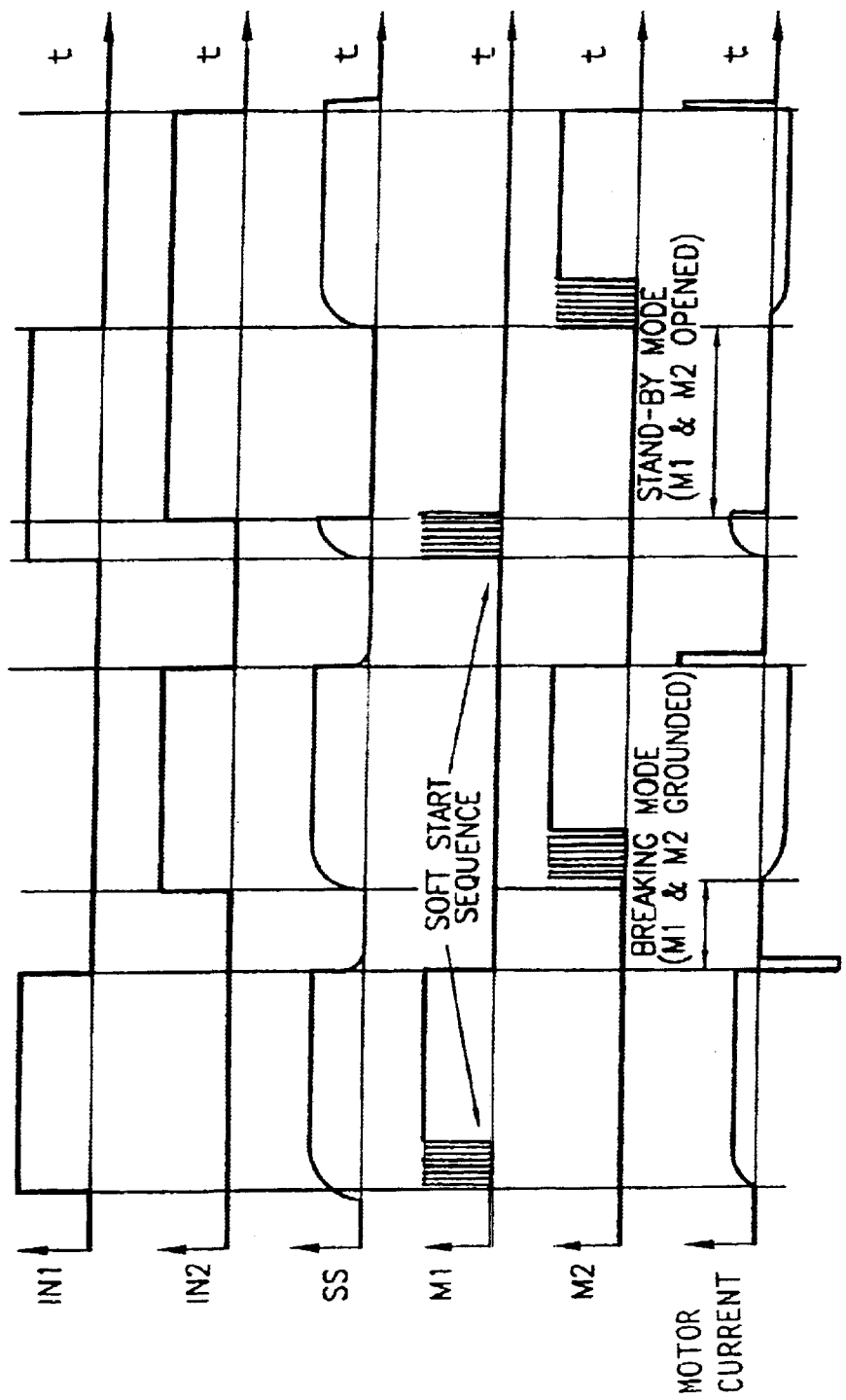

FIG. 18 shows a timing diagram for motor current versus the voltages at pins IN1; IN2; SS; M1 and M2. The soft start sequence of operation is shown on the M1 and M2 lines; the braking mode is shown with pins M1 and M2 grounded; and the stand-by mode is shown with pins M1 and M2 opened (high).

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An H-bridge driver for driving an electrical load; said H-bridge driver comprising first and second high side MOSFETs and first and second low side MOSFETs; each of said MOSFETs having respective drain, source and control electrodes; the drain electrodes of said high side MOSFETs and the source electrodes of said low side MOSFETs connected to power input terminals; the source electrodes of said first and second high side MOSFETs connected to the drain electrodes of said first and second low side MOSFETs respectively at first and second nodes which define output bridge terminals; a control IC for controlling the operation of said high side and low side MOSFETs; said control IC having input terminals connectable to receive input control signals from an exterior bridge control circuit and having output terminals connected to said control electrodes of said high side MOSFETs; a support for supporting said first and second high side MOSFETs and said control IC; and a common insulation housing enclosing said first and second high side MOSFETs and said IC; said first and second high side MOSFETs comprising intelligent power switches having output terminals communicating signals related to at least one of a switch current and to a MOSFET die temperature; said output terminals of at least one of intelligent power switch communicating an output signal for said at least said control IC to shut down said H-bridge when one of the switch current and the MOSFET die temperature exceed a threshold value.

2. An H-bridge driver for driving an electrical load; said H-bridge driver comprising first and second high side MOSFETs and first and second low side MOSFETs; each of said MOSFETs having respective drain, source and control electrodes; the drain electrodes of said high side MOSFETs and the source electrodes of said low side MOSFETs connected to power input terminals; the source electrodes of said first and second high side MOSFETs connected to the drain electrodes of said first and second low side MOSFETs respectively at first and second nodes which define output bridge terminals; a control IC for controlling the operation of said high side and low side MOSFETs; said control IC having input terminals connectable to receive input control signals from an exterior bridge control circuit and having output terminals connected to said control electrodes of said high side MOSFETs; a support for supporting said first and second high side MOSFETs and said control IC; and a common insulation housing enclosing said first and second high side MOSFETs and said control IC; and connection pins extending from said housing; said connection pins including N1 and N2 pins coupled to the respective control electrodes of said first and second high side MOSFETs, a $V_{cc}$ pin and a GND pin connected to said power input terminals, and M1 and M2 pins connected to said first and second nodes respectively.

3. The device of claim 2, wherein said low side MOSFETs are normally ON.

4. The device of claim 3, which further includes a shoot-thru prevention circuit in said control IC for turning on said first or second low side in response to the turn off of said first or second high side MOSFET respectively, when said first or second high side MOSFET output reaches a given low voltage value compared to its full output voltage.

5. The device of claim 2, wherein said control IC includes a PWM generator for applying a soft start PWM signal to said control electrodes of said low side MOSFETs.

6. An H-bridge driver for driving an electrical load; said H-bridge driver comprising first and second high side MOSFETs and first and second low side MOSFETs; each of said MOSFETs having respective drain, source and control electrodes; the drain K electrodes of said high side MOSFETs and the source electrodes of said low side MOSFETs connected to power input terminals; the source electrodes of said first and second high side MOSFETs connected to the drain electrodes of said first and second low side MOSFETs respectively at first and second nodes which define output bridge terminals; a control IC for controlling the operation of said high side and low side MOSFETs; said control IC having input terminals connectable to receive input control signals from an exterior bridge control circuit and having output terminals connected to said control electrodes of said high side MOSFETs; a support for supporting said first and second high side MOSFETs and said control IC; and a common insulation housing enclosing said first and second high side MOSFETs and said control IC; said low side MOSFETs both being normally ON.

7. The device of claim 6, which further includes a shoot-thru prevention circuit in said control IC for turning on said first or second low side device in response to the turn off of said first or second high side MOSFET respectively, and when said first or second high side MOSFET output reaches a given low voltage value compared to its full output voltage.

8. An H-bridge driver for driving an electrical load; said H-bridge driver comprising first and second high side MOSFETs and first and second low side MOSFETs; each of said MOSFETs having respective drain, source and control electrodes; the drain electrodes of said high side MOSFETs and the source electrodes of said low side MOSFETs connected to power input terminals; the source electrodes of said first and second high side MOSFETs connected to the drain electrodes of said first and second low side MOSFETs respectively at first and second nodes which define output bridge terminals; a control IC for controlling the operation of said high side and low side MOSFETs; said control IC having input terminals connectable to receive input control signals from an exterior bridge control circuit and having output terminals connected to said control electrodes of said high side MOSFETs; a support for supporting said first and second high side MOSFETs and said control IC; and a common insulation housing enclosing said first and second high side MOSFETs and said control IC; said IC including a PWM generator for applying a soft start PWM signal to said control electrodes of said low side MOSFETs.

9. The device of claim 8, wherein said low side MOSFETs are normally ON.

10. The device of claim 9, which further includes a shoot-thru prevention circuit in said control IC for turning on said first or second low side device in response to the turn off of said first or second high side MOSFET respectively, when said first or second high side MOSFET output reaches a given low voltage value compared to its full output voltage.

11. The H-bridge driver of claim 10, wherein said first and second high side MOSFETs are intelligent power switches and have output terminals with signals related to a switch current and to a MOSFET die temperature; said output terminals coupled to said control IC producing an output signal to said control IC for shut down of said H-bridge when either current or die temperature exceed a given value.

12. The H-bridge driver of claim 11, wherein said first and second high side MOSFETs are intelligent power switches and have output terminals with signals related to the switch current and to the MOSFET die temperature; said output terminals coupled to said control IC producing an output signal to said microcontroller for shut down of said H-bridge when either current or die temperature exceed a given value; said connection pins including a DG pin connected to said output signal produced by said control IC responsive to excessive die temperature or current.

13. The H-bridge driver of claim 9, which further includes an external RC circuit connected to said control IC for controlling the duty cycle of said soft start circuit.

14. The device of claim 8, wherein said low side MOSFETs are normally ON.

15. The H-bridge driver of claim 8, which further includes an external RC circuit connected to said control IC for controlling the duty cycle of said soft start circuit; said RC circuit including a resistor and capacitor.

16. The H-bridge driver of claim 15, wherein said connection pins include a $V_{RC}$ pin connected to one end of the resistor of said RC circuit, an SS pin connected to the node between the resistor and capacitor of said RC circuit and a GND pin connected to one end of the capacitor of said RC circuit.

17. The H-bridge driver of claim 15, wherein said connection pins include IN1 and IN2 pins coupled to the respective control electrodes of said first and second high side MOSFETs, a $V_{cc}$ pin and a GND pin connected to said power input terminals, and an M1 and M2 pins connected to said first and second nodes respectively.

18. The H-bridge driver of claim 17, wherein said connection pins include a $V_{RC}$ pin connected to one end of the resistor of said RC circuit, an SS pin connected to the node between the resistor and capacitor of said RC circuit and a GND pin connected to one end of the capacitor of said RC circuit.

* * * * *

UNITED STATES PATENT AND TRADEMARK OFFICE
CERTIFICATE OF CORRECTION

| | |
|---|---|
| PATENT NO. | : 6,747,300 B2 |
| APPLICATION NO. | : 10/091194 |
| DATED | : June 8, 2004 |
| INVENTOR(S) | : Bruno C. Nadd et al. |

It is certified that error appears in the above-identified patent and that said Letters Patent is hereby corrected as shown below:

Title Page, Item (73) Assignee: should read -- International Rectifier Corporation, El Segundo, CA (US) --

Signed and Sealed this

Twenty-second Day of January, 2008

JON W. DUDAS
*Director of the United States Patent and Trademark Office*